(12) United States Patent
Sato

(10) Patent No.: US 9,939,474 B2
(45) Date of Patent: Apr. 10, 2018

(54) METER WITH COMMUNICATION FUNCTION

(71) Applicant: KABUSHIKI KAISHA TOSHIBA, Minato-ku, Tokyo (JP)

(72) Inventor: Koichi Sato, Tachikawa Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 87 days.

(21) Appl. No.: 15/057,527

(22) Filed: Mar. 1, 2016

(65) Prior Publication Data
US 2017/0003331 A1    Jan. 5, 2017

(30) Foreign Application Priority Data

Jun. 30, 2015 (JP) .................................. 2015-131467

(51) Int. Cl.
| | | |
|---|---|---|
| *G01R 7/00* | (2006.01) | |
| *G01R 22/06* | (2006.01) | |
| *G01D 4/00* | (2006.01) | |

(52) U.S. Cl.
CPC ........... *G01R 22/063* (2013.01); *G01D 4/002* (2013.01); *Y02B 90/241* (2013.01); *Y04S 20/32* (2013.01)

(58) Field of Classification Search
CPC .... G01R 22/063; G01R 22/066; G01R 22/10; H01Q 1/38; H01Q 1/52; H01Q 1/526; H01Q 1/2233
See application file for complete search history.

(56) References Cited

U.S. PATENT DOCUMENTS

| | | | |
|---|---|---|---|
| 2005/0042990 A1 | 2/2005 | Otsuki | |
| 2011/0063172 A1* | 3/2011 | Podduturi | H01Q 1/2233 343/700 MS |
| 2013/0088406 A1 | 4/2013 | Hamada et al. | |
| 2014/0225806 A1* | 8/2014 | Lee | H01Q 1/243 343/905 |

FOREIGN PATENT DOCUMENTS

| | | |
|---|---|---|
| JP | 2005-065145 | 3/2005 |
| JP | 2011-081518 | 4/2011 |
| JP | 2012-156657 | 8/2012 |

\* cited by examiner

*Primary Examiner* — Minh N Tang
(74) *Attorney, Agent, or Firm* — Knobbe, Martens, Olson & Bear, LLP

(57) ABSTRACT

According to one embodiment, a meter with a communication function includes a terminal block, boards and an antenna. The terminal block, to which a power line is connected, is disposed at a predetermined position of an installation portion. The boards are disposed to be stacked on the terminal block to keep a distance in a direction away from the installation portion. The antenna is formed on a plate substrate disposed in a direction intersecting with the boards.

11 Claims, 8 Drawing Sheets

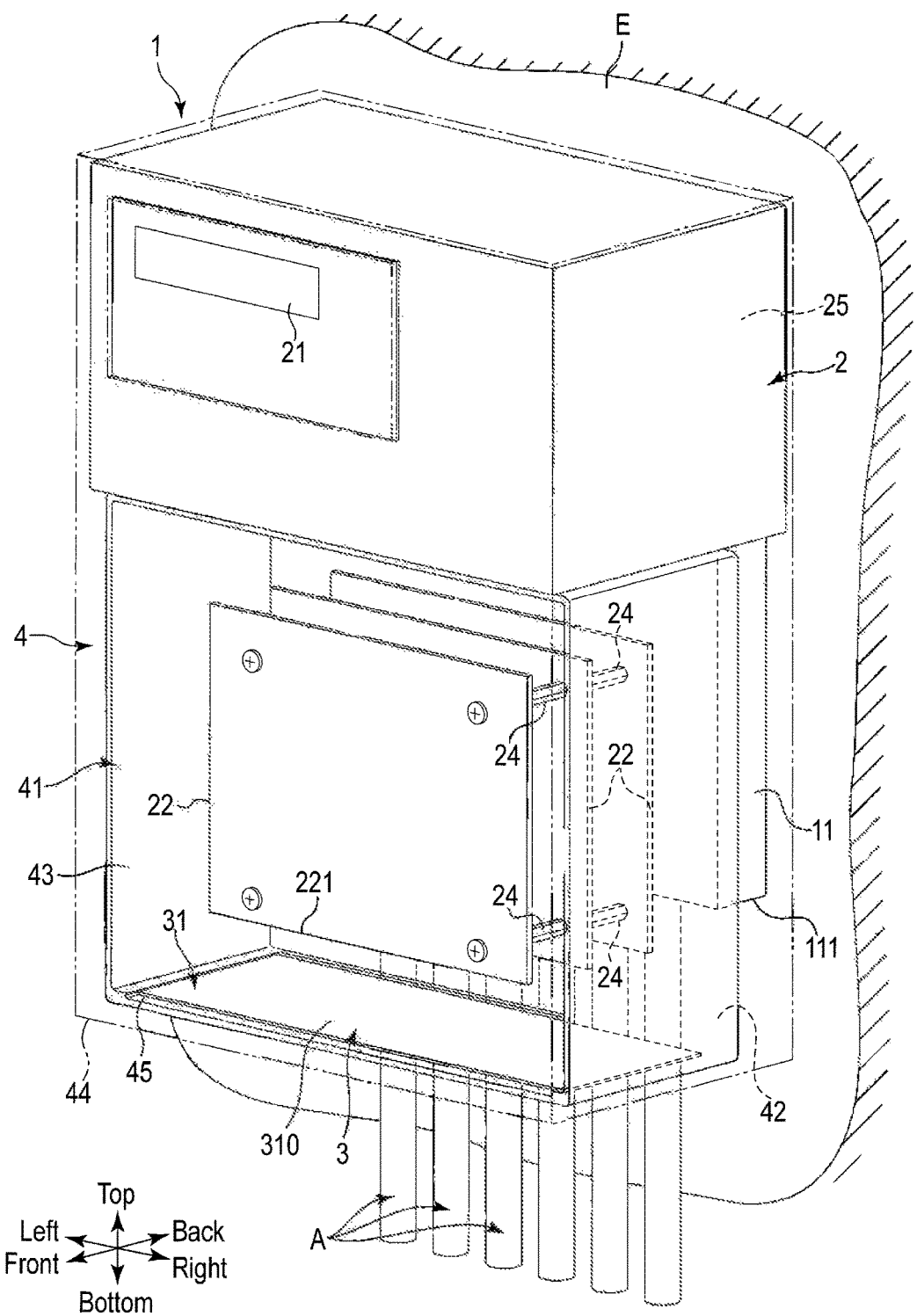
F I G. 1

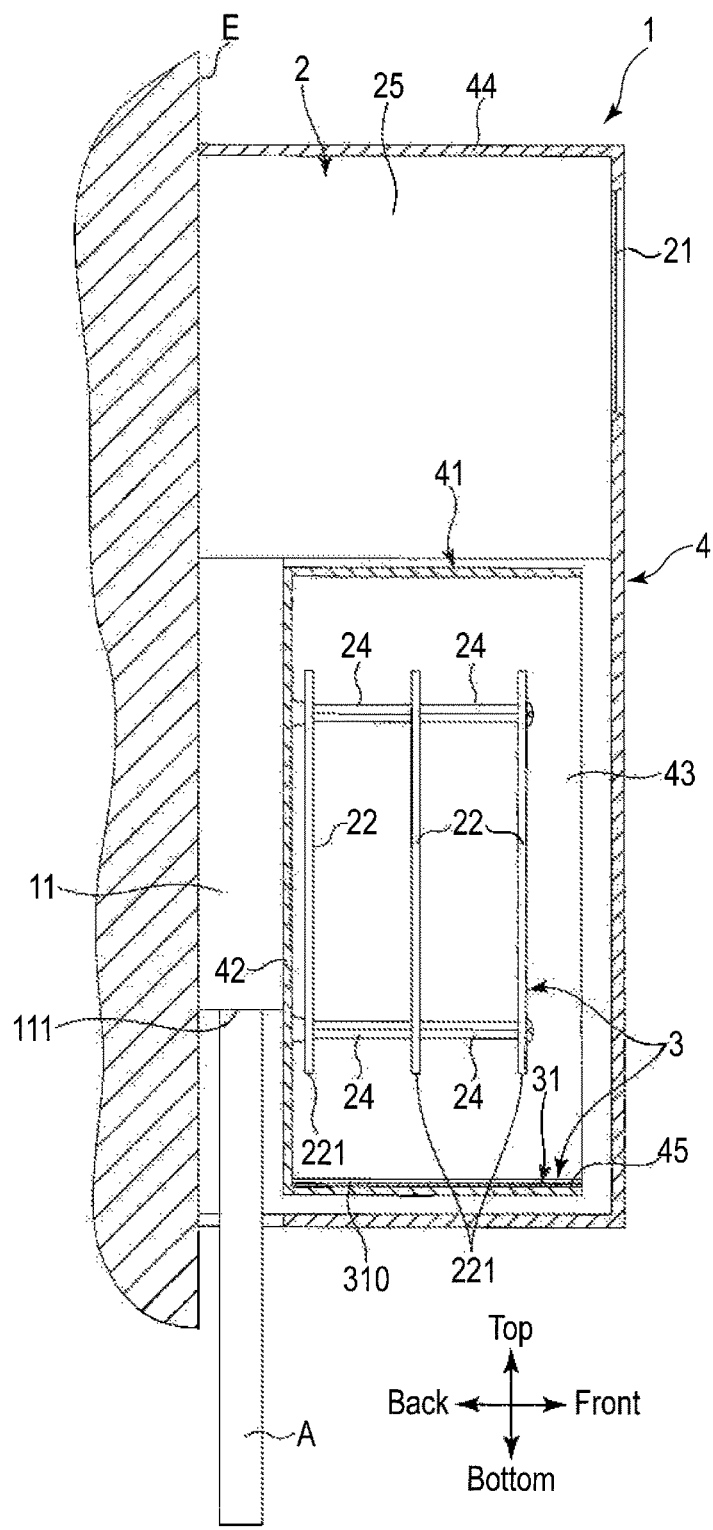
F I G. 3

METER WITH COMMUNICATION FUNCTION

CROSS-REFERENCE TO RELATED APPLICATIONS

This application is based upon and claims the benefit of priority from Japanese Patent Application No. 2015-131467, filed Jun. 30, 2015, the entire contents of which are incorporated herein by reference.

FIELD

Embodiments described herein relate generally to a meter with a communication function which measures such quantities as consumed electrical energy and communicates with an external device.

BACKGROUND

There is a meter device comprising a wattmeter which measures electrical energy consumed by users, a communication unit which converts the measured quantity into communication data and transmits it from an antenna, and a nonconductive protective cover covering them.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention. Throughout the drawings, reference numbers are re-used to indicate correspondence between referenced elements.

FIG. 1 is a perspective view showing a meter with a communication function of a first embodiment.

FIG. 3 is a cross-sectional view of the meter with the communication function taken along line F3-F3 of FIG. 2.

DETAILED DESCRIPTION

Figure 2:
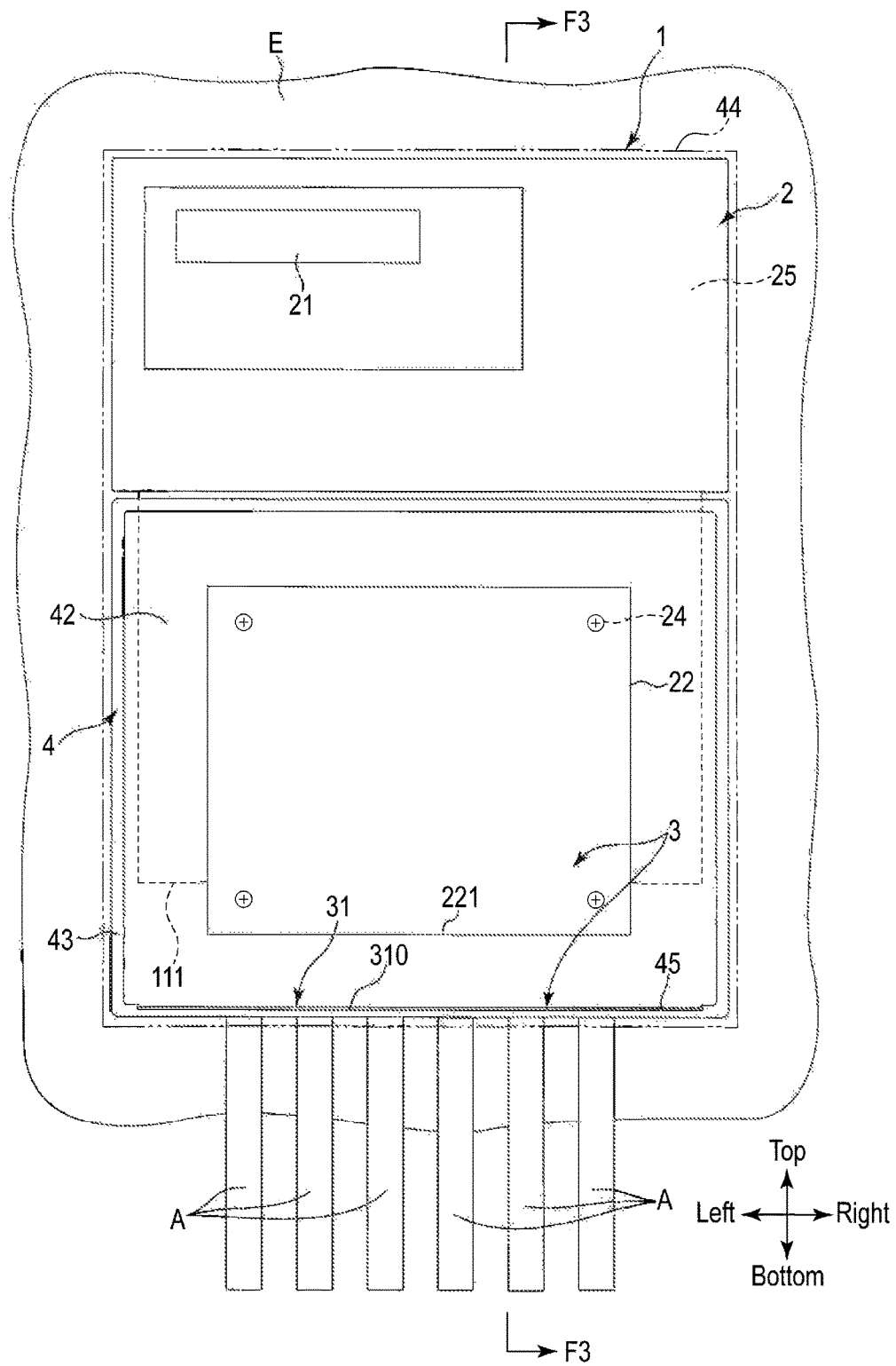
FIG. 2 is a front view showing an outline of the meter with the communication function of FIG. 1.

Various embodiments will be described hereinafter with reference to the accompanying drawings.

Since the meter serves not only as a device to be newly installed but also as a replacement for an existing wattmeter, its installation location, outside dimensions, etc., are specified by a power company in many cases. If an antenna is implemented in the meter without careful design for antenna performance, the antenna performance can be worsen by interference between the antenna and a circuit board in the meter.

According to following embodiments, a meter with a communication function in which an antenna is incorporated is provided.

In general, according to one embodiment, a meter is configured to be attached to a wall. The meter includes a terminal block, a plurality of circuit boards, and an antenna system. The terminal block includes power terminals configured to be connected to power cables. The plurality of circuit boards each has a first side including electronic components. The first side of each circuit board is parallel to the other first sides of each other circuit board in the plurality of circuit boards. The antenna system includes a substrate, a ground plane, and an antenna trace. At least a first portion of the antenna system is arranged substantially perpendicular to the first side of a circuit board in the plurality of circuit boards.

<First Section>

A meter 1 with a communication function of some embodiments will be described with reference to FIG. 1 to FIG. 3. The meter 1 with the communication function of FIG. 1 is equipped with a wattmeter 2 and a communication device 3, and is mounted on an installation portion E such as an outer wall or an entrance of a building, prepared in advance. This meter 1 with the communication function may measure and display the used electrical energy by the wattmeter 2, and can wirelessly connect to a network and transmit measured data to a power company having jurisdiction by the communication device 3. In the appearance of the meter 1 with the communication function shown in FIG. 1, a display 21 of the wattmeter 2 is disposed on the upper portion, and power cables A extend from a lower end. In this specification, for the convenience of explanation, in a state in which the meter 1 with the communication function is fixed on the installation portion E, the "top" and the "bottom" are defined with respect to the direction in which gravity acts, respectively, and from the perspective of an observer who views the display 21, the right part, the left part, the part near the observer, and the part near the installation portion E may be referred to as "right", "left" and "this part (front part)", and "back (rear part)", respectively.

The meter 1 with the communication function shown in FIG. 1 comprises a terminal block 11, boards 22, and an antenna 31. The antennas 31 may conform to a communication frequency band of so-called 3G, 4G-LTE, 4G, and/or 5G. The terminal block 11 comprises a plurality of terminals to be connected with power cables A. The terminal block 11 is joined to the wattmeter 2 by screws and/or a slot of the wattmeter in which a part of the terminal block is inserted. The terminal block 11 may have a hook or a hole to be joined to a hole or hook which is provided on the wattmeter 2. The wattmeter 2 is joined to a housing 4 (front cover 44) of the communication device 3 by screws and/or other mechanisms, as a result, the terminal block 11 is joined to the housing 4 (front cover 44). The terminal block 11 is disposed at a particular position of the installation portion E when the meter 1 with the communication function is mounted on the installation portion E. In addition, to the terminal block 11, the power cables A are connected from below through the front cover 44. If electricity is generated on the user side by photovoltaic electricity generation, etc., in addition to electricity supplied from a power company, a power cable A thereof may also be connected. In some embodiments, the boards 22 may include, but are not limited to, three boards, which are a power-supply board, a control board, and a communication board. The boards 22 each has electronic component on its surface side. These boards 22 are disposed to be stacked on the terminal block 11 to keep a distance in a direction away from the installation portion E. FIG. 2 is a front view of the meter 1 with the communication function viewed in a direction in which the boards 22 are stacked, and shows a state in which the lower end (bottom) of the boards 22 extends lower than a lower end 111 of the terminal block 11. The boards 22 are accommodated in a case 41 combined with the terminal block 11.

As shown in FIG. 1 to FIG. 3, the case 41 comprises a base portion 42 fixed to the terminal block 11 and an outer peripheral portion 43 rising from the outer periphery of the base portion in a direction away from the terminal block 11, and is made of a material which is synthetic resin of a nonconductive member and excels in durability against climatic changes and changes in temperature, for example, ABS, polycarbonate, and/or their composite can be used as the material. The boards 22 are held by studs 24 to keep a distance between each other as shown in FIG. 3. The wattmeter 2 comprises a measurement portion 25 which can measure the consumed electrical energy and/or the generated electrical energy, and the display 21 which displays the quantities measured by the measurement portion 25. In addition, the meter 1 with the communication function may be covered by the front cover 44. The front cover 44 includes an opening through which the display 21 is exposed. The case 41 and the front cover 44 are included in the housing 4.

The communication device 3 includes the communication board incorporated as one of the boards 22 and the antenna 31 connected to the communication board via a coaxial cable. The antenna 31 includes a flat plate substrate 310. An antenna trace and a ground pattern are formed on the flat plate substrate 310. The antenna trace may be formed in a part of the flat plate substrate 310 which is placed on a front side than the boards 22.

As shown in FIG. 2 and FIG. 3, the plate substrate 310 is disposed in a direction intersecting with the boards 22. More specifically, the flat plate 310 can be arranged substantially perpendicular to the surface of the boards 22. The antenna 31 is located in an area where it does not overlap the terminal block 11, i.e., it is located outside of the terminal block 11 when viewed in the direction perpendicular to the installation portion E or the surface of the boards 22, and in some embodiments, the antenna 31 is located lower than lower ends 221 of the boards 22. Specifically, the antenna 31 is held in a recess 45 formed in the shape of a dovetail groove on an inner surface of the outer peripheral portion 43 of the case 41 by being inserted therein in a direction along the inner surface. In addition, the antenna 31 is disposed to cross the outer peripheries of at least two of the boards 22 in the board-thickness direction. In some embodiments, as shown in FIG. 3, the plate substrate 310 of the antenna 31 is inserted to the base portion 42 of the case 41, and is disposed to cross the outer peripheries of the three boards 22 in the board-thickness direction thereof. In other words, the antenna 31 projects from a plane of a back or front surface of a first board into a front direction in FIG. 3, and the antenna 31 projects from a plane of a front or back surface of a second board into a backward direction in FIG. 3 (the first board is one of the boards 22 and the second board is another one of the boards 22 arranged between the first board and the terminal block 11, for example). The antenna 31 may be bonded to an inner surface of the case 41 instead of being inserted in the recess 45.

In the meter 1 with the communication function having the above-described structure, a direction in which the antenna 31 is held, that is, a plane on which the antenna 31 is formed, intersects with a direction in which the boards 22 are held, that is, a side on which circuits are formed. In some embodiments, as shown in FIG. 2 and FIG. 3, the plate substrate 310 of the antenna 31 is disposed to be perpendicular to a plane on which the boards 22 are disposed. Because of this disposition, harmful effect, which is high-frequency noise generated from the boards 22, to the antenna 31 can be reduced and the antenna's performance can be kept from declining.

In addition, because the terminal block 11 often includes a metal component, the antenna 31 is disposed at a position not overlapping the terminal block 11 when viewed in the direction perpendicular to the installation portion E or the surface of the boards 22. That is, no metal component is disposed on an extension of the plane of the plate substrate 310 on which the antenna 31 is formed, and thus, the antenna's performance can be kept from declining.

<Second Section>

A meter 1 with a communication function of some embodiments will be described with reference to FIG. 4 to FIG. 6. Structures having the same functions as those of the meter 1 shown in FIG. 1 to FIG. 3 will be explained with the same symbols assigned in the description and FIG. 4 to FIG. 6. Regarding details thereof, a corresponding description of one or more embodiments set forth above should be referred to.

Figure 4:
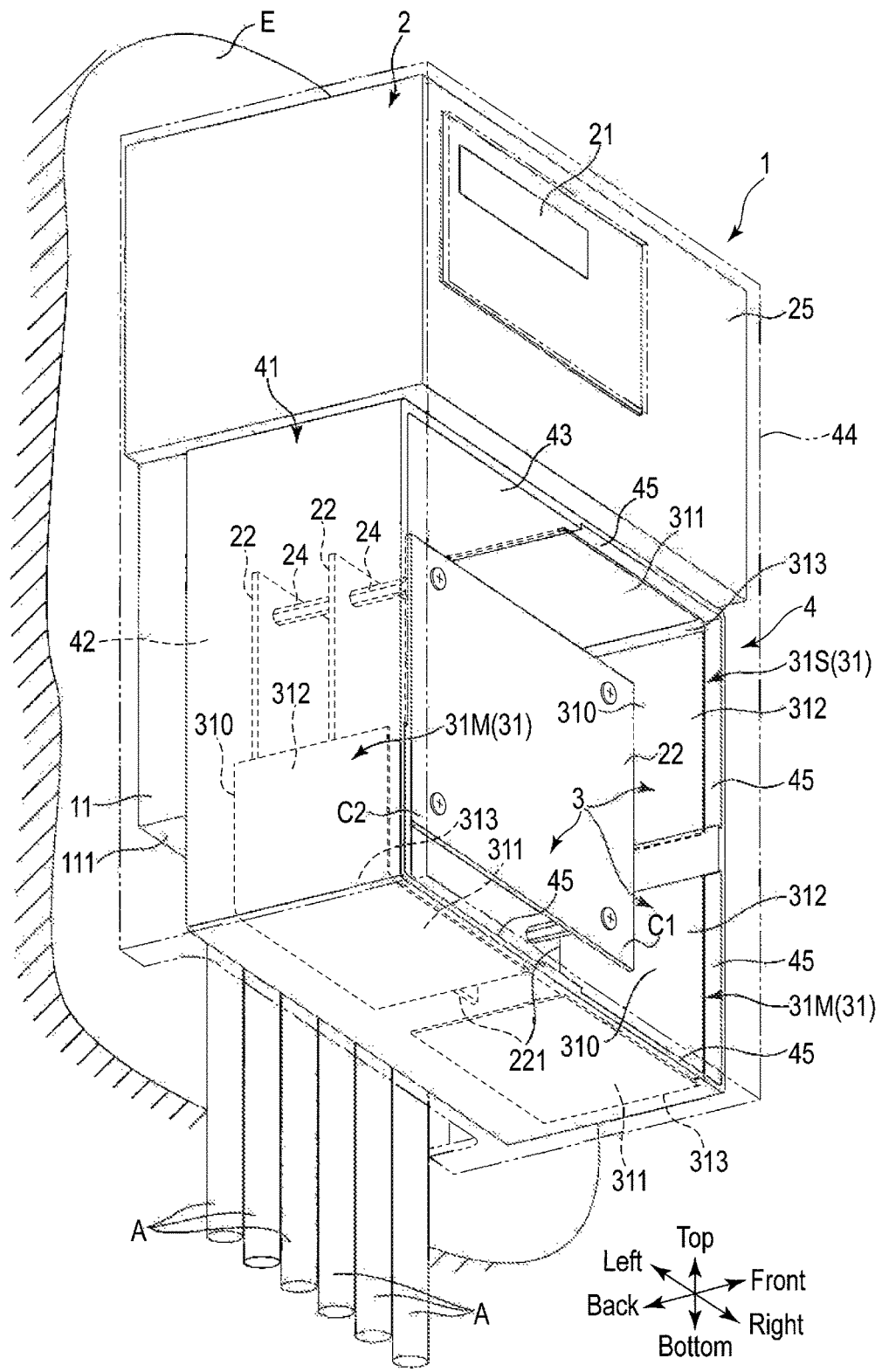
FIG. 4 is a perspective view showing a meter with a communication function of a second embodiment.
Figure 5:
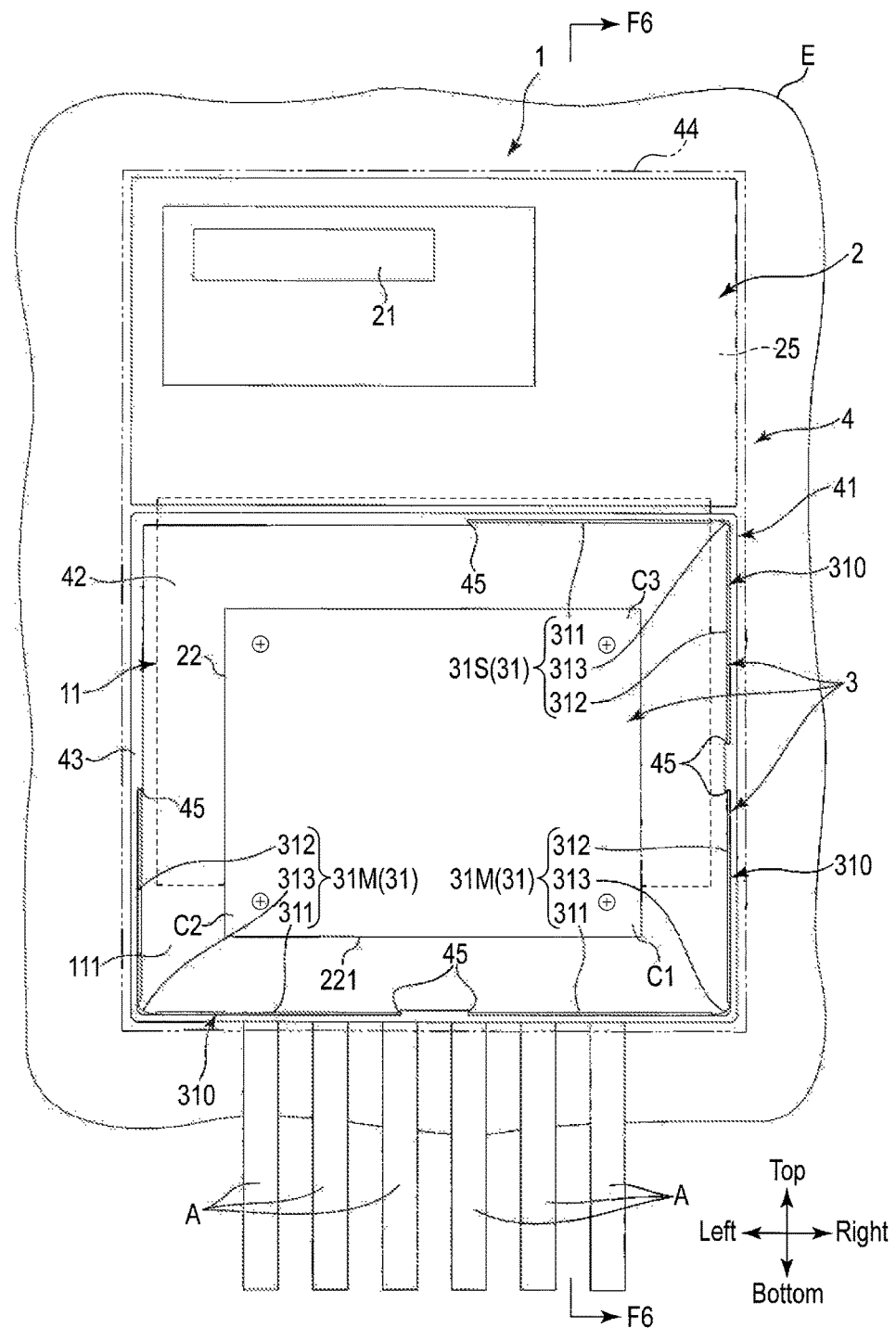
FIG. 5 is a plan view showing an outline of the meter with the communication function of FIG. 4.
Figure 6:
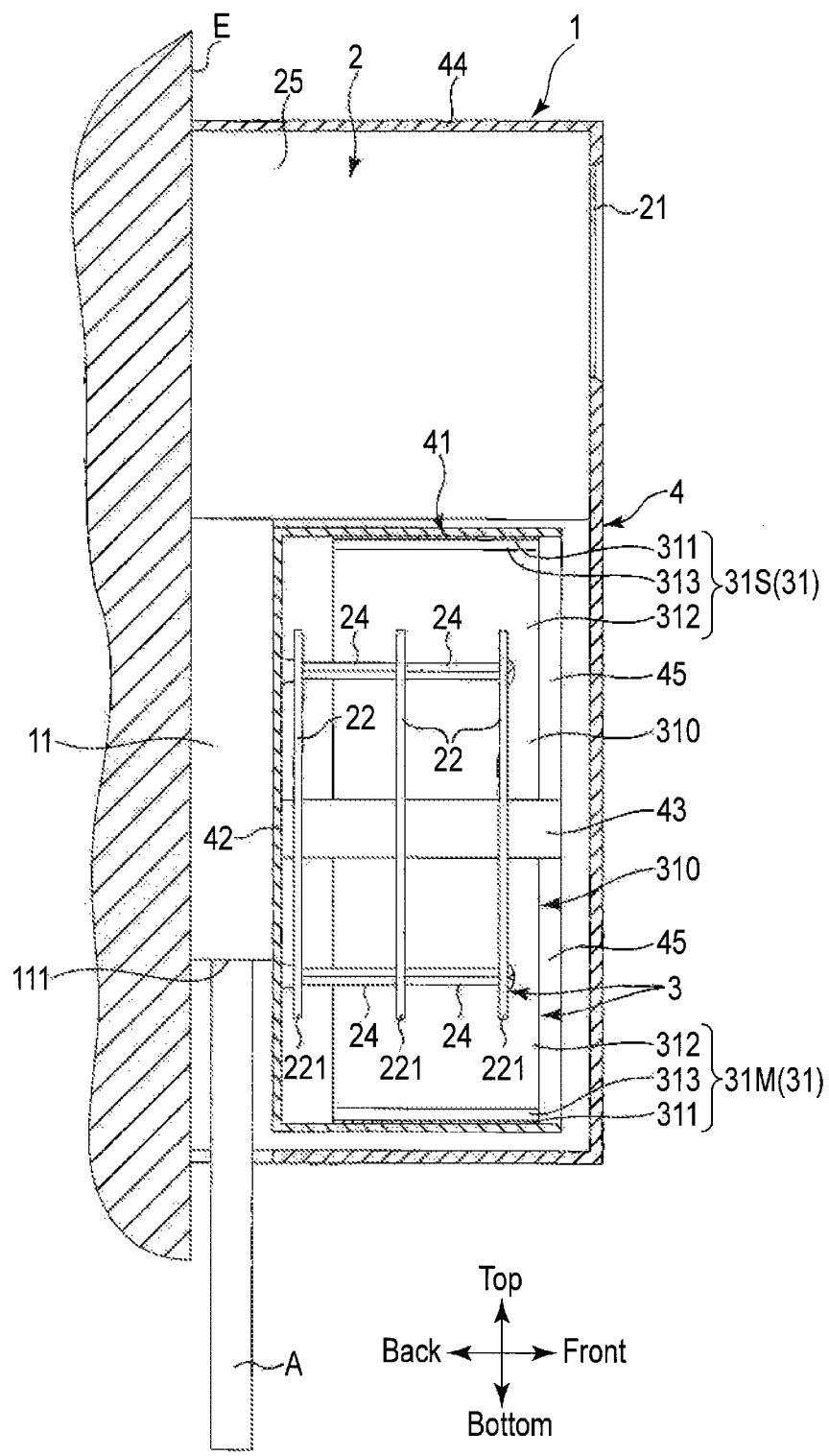
FIG. 6 is a cross-sectional view of the meter with the communication function taken along line F6-F6 of FIG. 5.

The meter 1 shown in FIG. 4 to FIG. 6 differs in the shape and the disposition of an antenna 31 from the meter 1 shown in FIG. 1 to FIG. 3. The meter 1 with the communication function of some embodiments includes, as antennas 31, multiband antennas 31M and a single-band antenna 31S. The multiband antennas 31M are antennas conforming to a communication frequency band of so-called 3G, 4G-LTE, 4G, and/or 5G, and the single-band antenna 31S is an antenna used in a communication frequency band different from that of the multiband antennas 31M and is used in, for example, communications in a band of 920 MHz, which is a sub-gigahertz band. The single-band antenna 31S may be used for Wireless Smart Utility Network Home Area Network (Wi-SUN-HAN: trademark). A plurality of meters form the Wi-SUN-HAN (multi-hop transmission network) to send information to a concentrator via meters.

Boards 22 comprise at least two corners not overlapping a terminal block 11 when viewed in a direction perpendicular to an installation portion E or the surface of the boards 22. In some embodiments, a first corner C1 and a second corner C2, which are the two corners of lower ends 221 extending downward. As shown in FIG. 4 and FIG. 5, the multiband antennas 31M are provided as a pair surrounding the outsides of the first corner C1 and the second corner C2. Specifically, the multiband antennas 31M are provided as a pair disposed in an L-shape along the insides of the lower two corners of a case 41 in the shape of a quadrilateral box, respectively.

Each of the multiband antennas 31M includes a first rigid portion 311, a second rigid portion 312, and a flexible portion 313. An antenna trace and a ground pattern are formed on at least one of the first rigid portion 311, the second rigid portion 312, and a flexible portion 313. The antenna trace may be formed in a part of the portions 311, 312, and 313 which are placed on a front side than the boards 22.

The first rigid portion 311 is disposed to cross the outer peripheries of the boards 22 in the board-thickness direction. In some embodiments, the first rigid portion 311 is disposed below the boards 22 in a direction along the lower ends 221 of the boards 22 as shown in FIG. 5. The second rigid portion 312 is disposed to cross the outer peripheries of the boards 22 in the board-thickness direction, and in a direction intersecting with the first rigid portion 311. Both of the first rigid portion 311 and the second rigid portion 312 are disposed in a direction intersecting with the boards 22, more specifically, both of the first rigid portion 311 and the second rigid portion 312 can be arranged substantially perpendicular to the surfaces of the boards 22. In some embodiments, the second rigid portion 312 is disposed on each of the left outside and the right outside of the boards 22, such that the first corner C1, the second corner C2 and the first rigid portion 311 are interposed between the second rigid portions 312, as shown in FIG. 5. The flexible portion 313 is continuously formed from the first rigid portion 311 to the second rigid portion 312 to connect the first rigid portion 311 and the second rigid portion 312.

In addition, the single-band antenna 31S is disposed to surround the outside of a third corner C3 of the boards 22 on the opposite side to the first corner C1 and the second corner C2, where the multiband antennas 31M are disposed. In some embodiments, the third corner C3 is an upper right part of the boards 22 when the meter 1 with the communication function is viewed from the front as shown in FIG. 5. The single-band antenna 31S is formed in an L-shape including a first rigid portion 311, a second rigid portion 312, and a flexible portion 313 as in the case of the multiband antennas 31M. An antenna trace and a ground pattern for the single-band antenna 31S are formed on at least one of the first rigid portion 311, the second rigid portion 312, and a flexible portion 313. The antenna trace may be formed in a part of the portions 311, 312, and 313 which are placed on a front side than the boards 22.

The single-band antenna 31S is a third antenna provided as an antenna 31 of a communication device 3 in addition to the multiband antennas 31M provided as a pair of antennas 31. As shown in FIG. 5, the first rigid portion 311 of the single-band antenna 31S is disposed between the boards 22 and a measurement portion 25 of a wattmeter 2 disposed above the boards 22, and the second rigid portion 312 is disposed on the right outside of the boards 22. Moreover, the second rigid portion 312 of the single-band antenna 31S is disposed at a position not overlapping the terminal block 11 in the direction away from the installation portion E.

The case 41 comprises recesses 45 in areas corresponding to the corners C1, C2, and C3 of the boards 22, respectively, on an inner surface of an outer peripheral portion 43. The recesses 45 are formed in the shape of a dovetail groove into which the multiband antennas 31M and the single-band antenna 31S can be inserted from the front side along the board-thickness direction of the boards 22 and which prevents the multiband antennas 31M and the single-band antenna 31S from falling off toward the boards 22. As shown in FIG. 6, the multiband antennas 31M and the single-band antenna 31S are inserted into the recesses 45, and are disposed to cross the outer peripheries of at least two boards 22 of the boards 22 in the board-thickness direction.

In the meter 1 shown in FIG. 4 to FIG. 6 having the above-described structure, as in the meter 1 shown in FIG. 1 to FIG. 3, a direction in which the antennas 31 are held, that is, a plane on which the multiband antennas 31M and the single-band antenna 31S are formed, intersects with a direction in which the boards 22 are held, that is, a plane on which circuits are formed. Further, in some embodiments, the multiband antennas 31M are provided as a pair and are disposed, such that the second rigid portions 312 are orthogonal to the respective first rigid portions 311. Therefore, each of the antennas 31 is hardly influenced by high-frequency noise from the boards 22. In addition, since they are distant from the terminal block 11 including a metal component, the antennas' performance can be kept from declining.

Moreover, the single-band antenna 31S used in a communication frequency band different from a communication frequency band of the multiband antennas 31M is disposed on the opposite side to the multiband antennas 31M with the boards 22 interposed therebetween in a direction along the installation portion E. In some embodiments, the multiband antennas 31M are disposed at positions lower than lower ends 221 of the boards 22, and the single-band antenna 31S is disposed at a position where a part thereof is interposed between the boards 22 and the measurement portion 25. Therefore, interference between the multiband antennas 31M and the single-band antenna 31S can be reduced, and the antennas' respective performance can be easily exhibited.

In some embodiments, the multiband antennas 31M as the antennas 31 are disposed as a pair to surround the outsides of the corners (the first corner C1 and the second corner C2), respectively, of the lower ends 221 of the boards 22; however, the antennas 31 may be disposed to surround the outside of one of the corners.

<Third Section>

Figure 7:
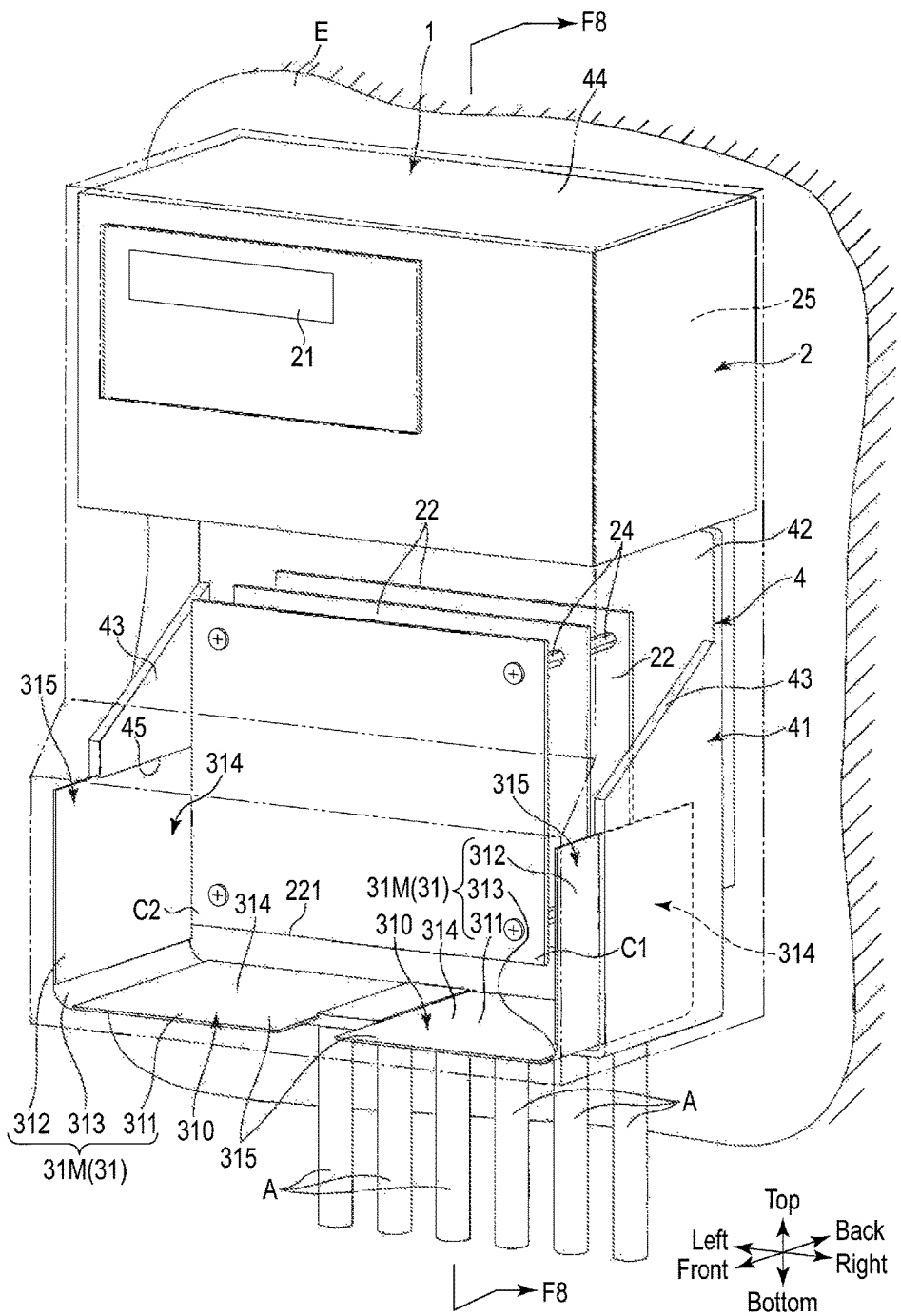
FIG. 7 is a perspective view showing a meter with a communication function of a third embodiment.

A meter 1 with a communication function of some embodiments will be described with reference to FIG. 7 and FIG. 8. Structures having the same functions as those of the meter 1 shown in FIG. 1 to FIG. 6 will be explained with the same symbols assigned in the description and the FIG. 7 and FIG. 8. Regarding details thereof, a corresponding description of one or more embodiments set forth above should be referred to.

The meter 1 with the communication function of some embodiments comprises multiband antennas 31M as antennas 31. The disposition of the multiband antennas 31M of some embodiments is the same as the disposition of the multiband antennas 31M of FIG. 5, in which the meter 1 is viewed from the front. When being viewed laterally, the disposition of the multiband antennas 31M shown in FIG. 8 is different from the disposition of the multiband antennas 31M shown in FIG. 6.

The multiband antennas 31M are disposed as a pair surrounding the outsides of a first corner C1 and a second corner C2, respectively, which are two corners of lower ends 221 of boards 22. A display (electrical energy display) 21 of a wattmeter 2 of the meter 1 with the communication function is disposed on the opposite side to the multiband antennas 31M with the boards 22 interposed therebetween in a direction along an installation portion E. The multiband antennas 31M each comprise a ground portion 314 having a ground pattern and a pattern portion having an antenna trace 315 of the antennas 31. A flexible portion 313 joins a first rigid portion 311 and a second rigid portion 312 to each other.

The ground portion 314 is disposed to cross the outer peripheries of at least two boards 22 in the board-thickness direction in an area not overlapping a terminal block 11 when viewed in a direction perpendicular to the installation portion E or the surface of the boards 22. In some embodiments, as shown in FIG. 8, the first rigid portion 311, the second rigid portion 312, and the flexible portion 313 constituting a plate substrate of each of the multiband antennas 31M are inserted to the back along a recess 45 formed on an inner surface of an outer peripheral portion 43 of a case 41 toward the installation portion E, and cross the outer peripheries of the three boards 22 in the board-thickness direction.

Figure 8:
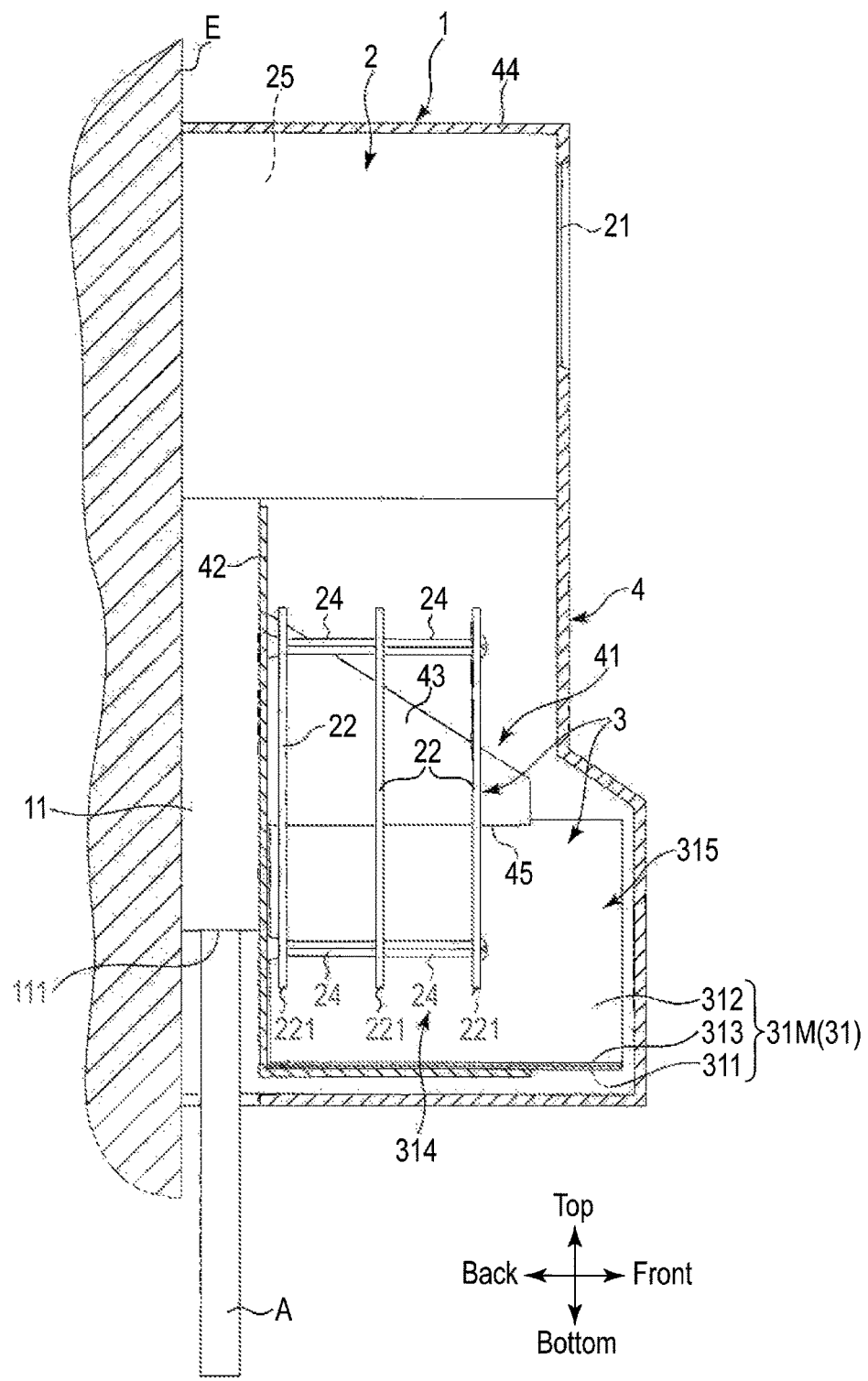
FIG. 8 is a cross-sectional view of the meter with the communication function taken along line F8-F8 of FIG. 7.

In addition, in a state in which each of the multiband antennas 31M of some embodiments is inserted to the back of the recess 45, at least a part of the pattern portion 315 projects more than the display 21 when viewed in the direction perpendicular to the installation portion E or the surface of the boards 22, as shown in FIG. 8. As shown in FIG. 7 and FIG. 8, the case 41 comprises the outer peripheral portion 43 in areas corresponding to positions where the multiband antennas 31M, which are the antennas 31, are disposed, and is smaller than the multiband antennas 31M when viewed in the direction perpendicular to the installation portion E or the surface of the boards 22. That is, the multiband antennas 31M are exposed from the recesses 45 of the case 41 to the front side, when the meter 1 with the communication function is viewed from the front. A front cover 44 swells to the front side to protect the projecting multiband antennas 31M.

The case 41 may be formed to a position over the multiband antennas 31M when viewed in the direction perpendicular to the installation portion E or the surface of the boards 22. In addition, the pattern portion 315 of each of the multiband antennas 31M (the antennas 31) may be more recessed toward the installation portion E than the display 21, as long as it projects to the front side more than a board 22 disposed at the forefront of the boards 22 disposed to be stacked in the direction away from the installation portion E. Moreover, the meter 1 may comprise a single-band antenna 31S as in one or more embodiments referring to FIG. 4 to FIG. 6, or may be in the shape of a flat plate along the lower ends 221 of the boards 22 as in one or more embodiments referring to FIG. 1 to FIG. 3.

In the meter 1 with of some embodiments having the above-described structure, a direction in which the antennas 31 are held, that is, a plane on which the multiband antennas 31M are formed, intersects with a direction in which the boards 22 are held, that is, a plane on which circuits are formed. In some embodiments, the directions are orthogonal to each other. Moreover, each of the multiband antennas 31M provided as a pair is disposed, such that the second rigid portion 312 is orthogonal to the first rigid portion 311. Therefore, each of the antennas 31 is hardly influenced by high-frequency noise from the boards 22. In addition, since they are distant from the terminal block, the antennas' performance can be kept from declining.

Moreover, at least a part of the pattern portion 315 of each of the antennas 31 projects more than a display screen of the display 21 when viewed in the direction perpendicular to the installation portion E or the surface of the boards 22, that is, the antennas 31 project the most in the meter 1 with the communication function with respect to the installation portion E on which the meter 1 with the communication function is mounted. Therefore, the antennas' performance is easily exhibited. In addition, in which direction the pattern portion 315 of each of the antennas 31 is formed in the plane of a plate substrate 310 can be changed depending on a communication frequency band or its characteristics. That is, the antennas 31 are not limited to those in which the ground portion 314 and the pattern portion 315 are clearly separated at a boundary. Accordingly, it is also included in a part of some embodiments that at least parts of the antennas 31 project more than the display 21 when viewed in the direction perpendicular to the installation portion E or the surface of the boards 22, or project to the front side more than the board 22 located at the forefront.

In the meters 1 with the communication functions in the first to third embodiment, antennas (multiband antennas 31M and single-band antenna 31S) 31 are incorporated to be held in an inner surface of an outer peripheral portion 43 of a case 41 accommodating boards 22. Therefore, even if a front cover 44 is detached at the time of assembly or maintenance, the antennas 31' functions and performance can be maintained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A meter configured to be attached to a wall, comprising:
a terminal block comprising power terminals, the power terminals configured to be connected to power cables;
a plurality of circuit boards each having a first side including electronic components, wherein the first side of each circuit board is parallel to the other first sides of each other circuit board in the plurality of circuit boards, and
an antenna system comprising a substrate, a ground pattern, and an antenna trace, wherein at least a first portion of the antenna system is arranged substantially perpendicular to the first side of a circuit board in the plurality of circuit boards, wherein:
the terminal block comprises a second side, a third side opposite to the second side, the second side of the terminal block configured to be attached to the wall;
at least some of the plurality of circuit boards overlaps with each other when viewed in the direction perpendicular to the first side;
at least a part of the plurality of circuit boards overlaps with the terminal block when viewed in the direction perpendicular to the first side; and
at least a part of the plurality of circuit boards is attacked to the third side of the terminal block.

2. The meter of claim 1, wherein
the antenna system is located outside of the terminal block when viewed in a direction perpendicular to the first side.

3. The meter of claim 2, wherein
at least some of the plurality of circuit boards comprise at least two corners located outside of the terminal block when viewed in the direction perpendicular to the first side, and
the antenna system surrounding an outside of at least the two corners when viewed in the direction perpendicular to the first side.

4. The meter of claim 3, further comprising
a second antenna system surrounding an outside of a third corner of the at least some of the plurality of circuit boards when viewed in the direction perpendicular to the first side, the second antenna system configured to communicate using a different frequency band than a communication frequency band used by the antenna system.

5. The meter of claim 1, wherein
the plurality of circuit boards comprises a first circuit board and a second circuit board at least partially arranged between the terminal block and the first circuit board, at least a part of the first circuit board overlapping at least a part of the second circuit board when viewed in a direction perpendicular to the first side, and the a first portion of the antenna system comprises a portion projecting from a plane of the first side of the first circuit board into a direction away from the terminal block and a portion projecting from a plane of the first side of the second circuit board into a direction toward the terminal block.

6. The meter of claim 5, wherein the antenna system comprises a first rigid portion, a second rigid portion, and a flexible portion connecting the first rigid portion and the second rigid portion.

7. The meter of claim 6, wherein the first rigid portion comprises the first portion.

8. The meter of claim 7, wherein the second rigid portion is arranged substantially perpendicular to the first side of a circuit board from the plurality of circuit boards.

9. The meter of claim 8, wherein the second rigid portion comprises a portion projecting from the plane of the first side of the first circuit board into the direction away from the terminal block and a portion projecting from the plane of the first side of the second circuit board into the direction toward the terminal block.

10. The meter of claim 1, wherein the first portion comprises at least a part of the substrate, at least a part of the ground pattern, and at least a apart of the antenna trace.

11. The meter of claim 1, further comprising a display comprising a display screen, wherein at least a part of the plurality of circuit boards is located between the display and the antenna system, and comprises a first circuit board and a second circuit board at least partially arranged between the terminal block and the first circuit board, the ground pattern is located outside of the terminal block when viewed in a direction perpendicular to the first side, the ground pattern is arranged perpendicularly to the first side, the ground pattern comprises a portion projecting from a plane of the first side of the first circuit board into a direction away from the terminal block and a portion projecting from a plane of the first side of the second circuit board into a direction toward the terminal block, and the antenna trace projects from a plane of the display screen into a direction away from the terminal block.

\* \* \* \* \*